US008706469B2

(12) United States Patent
Beausoleil et al.

(10) Patent No.: US 8,706,469 B2
(45) Date of Patent: Apr. 22, 2014

(54) METHOD AND APPARATUS FOR INCREASING THE EFFICIENCY OF AN EMULATION ENGINE

(75) Inventors: William F. Beausoleil, Hopewell Junction, NY (US); Steven T. Comfort, Poughkeepsie, NY (US); Beshara G. Elmufdi, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1491 days.

(21) Appl. No.: 11/344,058

(22) Filed: Jan. 31, 2006

(65) Prior Publication Data
US 2007/0198809 A1   Aug. 23, 2007

(51) Int. Cl.
*G06F 9/455* (2006.01)
*G06F 17/50* (2006.01)
*G06F 13/10* (2006.01)

(52) U.S. Cl.
CPC .......... *G06F 17/5027* (2013.01); *G06F 13/105* (2013.01); *G06F 17/5054* (2013.01)
USPC .......................................................... 703/23

(58) Field of Classification Search
USPC .............. 703/23, 28, 25; 712/222; 716/17, 18
See application file for complete search history.

(56) References Cited

U.S. PATENT DOCUMENTS

| 5,313,618 | A | * | 5/1994 | Pawloski | 703/28 |
| 5,551,013 | A | * | 8/1996 | Beausoleil et al. | 703/23 |
| 5,966,528 | A | * | 10/1999 | Wilkinson et al. | 712/222 |
| 6,173,425 | B1 | * | 1/2001 | Knaack et al. | 714/718 |
| 6,618,698 | B1 | | 9/2003 | Beausoleil et al. | |
| 7,047,179 | B2 | * | 5/2006 | Beausoleil et al. | 703/23 |
| 7,185,309 | B1 | * | 2/2007 | Kulkarni et al. | 716/18 |
| 7,228,520 | B1 | * | 6/2007 | Keller et al. | 716/17 |
| 7,281,093 | B1 | * | 10/2007 | Kulkarni et al. | 711/148 |
| 2003/0212539 | A1 | * | 11/2003 | Beausoleil et al. | 703/25 |
| 2004/0006584 | A1 | * | 1/2004 | Vandeweerd | 709/107 |

* cited by examiner

*Primary Examiner* — Thai Phan
*Assistant Examiner* — Cuong Luu
(74) *Attorney, Agent, or Firm* — Holland & Knight LLP; Mark H. Whittenberger, Esq.

(57) ABSTRACT

A method and apparatus for improving the efficiency of a processor-based emulation engine. The emulation engine is composed of a plurality of processors, each processor capable of emulating a logic gate. Processors are arranged into groups of processors called clusters. Each processor receives inputs, processes the inputs, and stores the outputs in an output array. The output array allows processors within a cluster to fetch an output from a processor that was written to the output array during a previous cycle. The output array can also store and transfer data between clusters of processors. Consequently, the number of cycles that a processor or a cluster has to wait to fetch data is greatly reduced and the efficiency of the emulation engine is increased.

17 Claims, 8 Drawing Sheets

METHOD AND APPARATUS FOR INCREASING THE EFFICIENCY OF AN EMULATION ENGINE

BACKGROUND OF THE INVENTION

1. Field of the Invention

Embodiments of the present invention generally relate to an emulation engine for emulating a system composed of logic gates, and more particularly, to a method and apparatus for improving the efficiency of the emulation engine.

2. Description of the Related Art

Hardware emulators are programmable devices used in the verification of hardware design. A common method of hardware design verification is to use processor-based hardware emulators to emulate the design. These processor-based emulators sequentially evaluate combinatorial logic levels, starting at the inputs and proceeding to the outputs. Each pass through the entire set of logic levels is known as a cycle; the evaluation of each individual logic level is known as an emulation step.

An exemplary hardware emulator is described in commonly assigned U.S. Pat. No. 6,618,698 titled "Clustered Processors In An Emulation Engine", which is hereby incorporated by reference in its entirety. Hardware emulators allow engineers and hardware designers to test and verify the operation of an integrated circuit, an entire board of integrated circuits, or an entire system without having to first physically fabricate the hardware.

The complexity and number of logic gates present on an integrated circuit has increased significantly in the past several years. Hardware emulators need to improve in efficiency to keep pace with the increased complexity of integrated circuits. The speed with which a hardware emulator can emulate an integrated circuit is one of the most important benchmarks of the emulator's efficiency, and also one of the emulator's most important selling factors in the emulator market.

A hardware emulator is comprised of multiple processors. The processors are arranged into groups of processors called dusters, and the clusters of processors collectively comprise the emulation engine. During each process cycle, each processor is capable of emulating a logic gate, mimicking the function of a logic gate in an integrated circuit. The processors are arranged to compute results in parallel, in the same way logic gates present in an integrated circuit compute many results in parallel. This creates a chain of logic similar to what occurs in an integrated circuit. In the chain of logic, efficient communication between processors is crucial.

To facilitate data transfer within an emulator, processors within a cluster can receive data directly from the other processors. The output of processors within a cluster is generally stored for a number of cycles within a data array to enable the processors to utilize previous output data in a current computation.

Communication between clusters of processors is generally less efficient than communication within a cluster. A cluster can obtain N inputs (where N is the number of processors in the duster) from any other cluster in the emulation engine. Similarly, each cluster can send N outputs to the other clusters. A duster can receive outputs from signals available during the current cycle inside another cluster. These signals include the current processor outputs, processor inputs, cluster inputs, and memory inputs. Outputs that were produced during a previous cycle must first be fetched from the data array before becoming available to another cluster.

The speed of communication between processors, and between clusters of processors, is directly related to the availability of data to the processors and the clusters of processors. A processor has to use one of its inputs to retrieve data from a data array if the data is unavailable during the current cycle. This reduces the efficiency of the processor. Communication between clusters of processors may also be impeded by lack of an available communication path between clusters. A cluster may have to wait extra cycles for the needed data to be communicated. The extra cycles include a cycle for the data to be retrieved from the data array, and the cycles until a communication path becomes available. This results in slower hardware emulation.

Thus, there is a need in the art for a method and apparatus that improves communication between processors and dusters of processors, and improves the overall efficiency of a multiprocessor based emulation engine.

SUMMARY OF THE INVENTION

The present invention generally relates to an improved processor-based emulation engine. The emulation engine is composed of a plurality of processors, each processor capable of emulating a logic gate. The processors are arranged into groups of processors called dusters. Each processor in a duster has access to the output of all the other processors, and a cluster has access to the output of all the other clusters within the emulation engine. The present invention improves upon previous emulation engines by storing the output of the processors within a cluster in an output array referred to herein as a node bit out array. Storing the previous outputs in a node bit out array allows processors within a cluster to fetch an output from a processor that was written to the node bit out array during a previous cycle. The node bit out array can also store and transfer data between clusters of processors. Conventional emulation engines only allow data to be transferred between clusters that is available during the current cycle. Thus, the number of cycles that a processor or cluster has to wait to fetch data is greatly reduced and the efficiency of the emulation engine is increased.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention is an improved method and apparatus for increasing the efficiency an emulation engine. An exemplary emulation engine is disclosed in U.S. Pat. No. 6,618,698 "Clustered Processors In An Emulation Engine" and U.S. Pat. No. 5,551,013 "Multiprocessor For Hardware Emulation" which are hereby incorporated by reference in their entirety.

Figure 1:
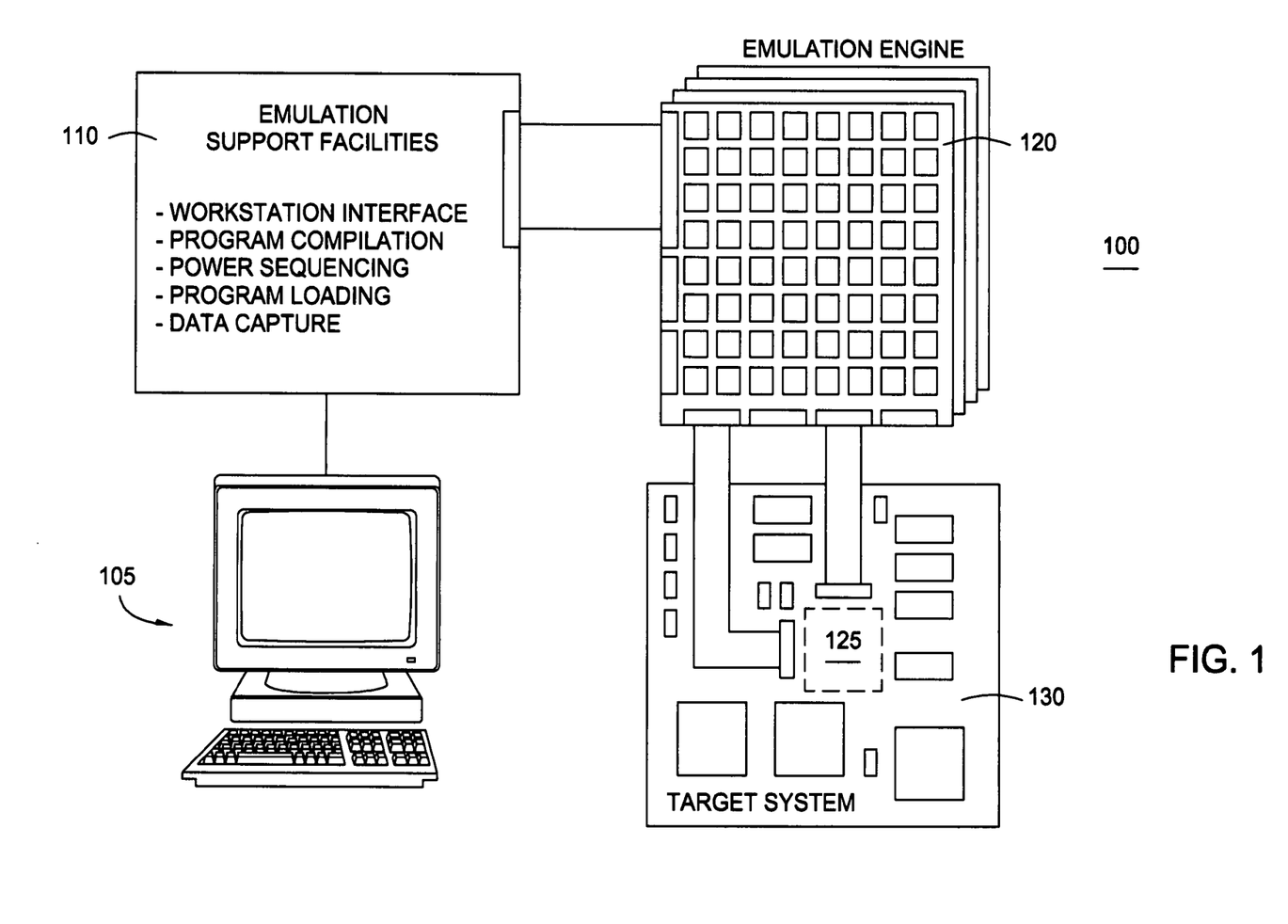
FIG. 1 is an overview of an emulation system.

FIG. 1 is an overview of an emulation system 100. The system comprises a computer workstation 105, emulation support facilities 110, an emulation engine 120 and a target system 130. The computer workstation 105 is coupled to the emulation support facilities 110. The computer workstation 105 allows a user to interface with the emulation engine 120, control the emulation process and collect emulation results for analysis. The emulation support facilities 110 provide a workstation interface, program compilation, power sequencing, program loading and data capture. Under control of the computer workstation 105, programming information and data is loaded to the emulation engine 120 from the support facilities 110.

In response to the programming received from the emulation support facilities 110, the emulation engine 120 emulates a portion 125 of the target system 130. The portion 125 of the target system 130 may be an integrated circuit, a memory, a processor, or any object or device that can be emulated in a programming language. Popular emulation programming languages include Verilog and VHDL.

Figure 2:
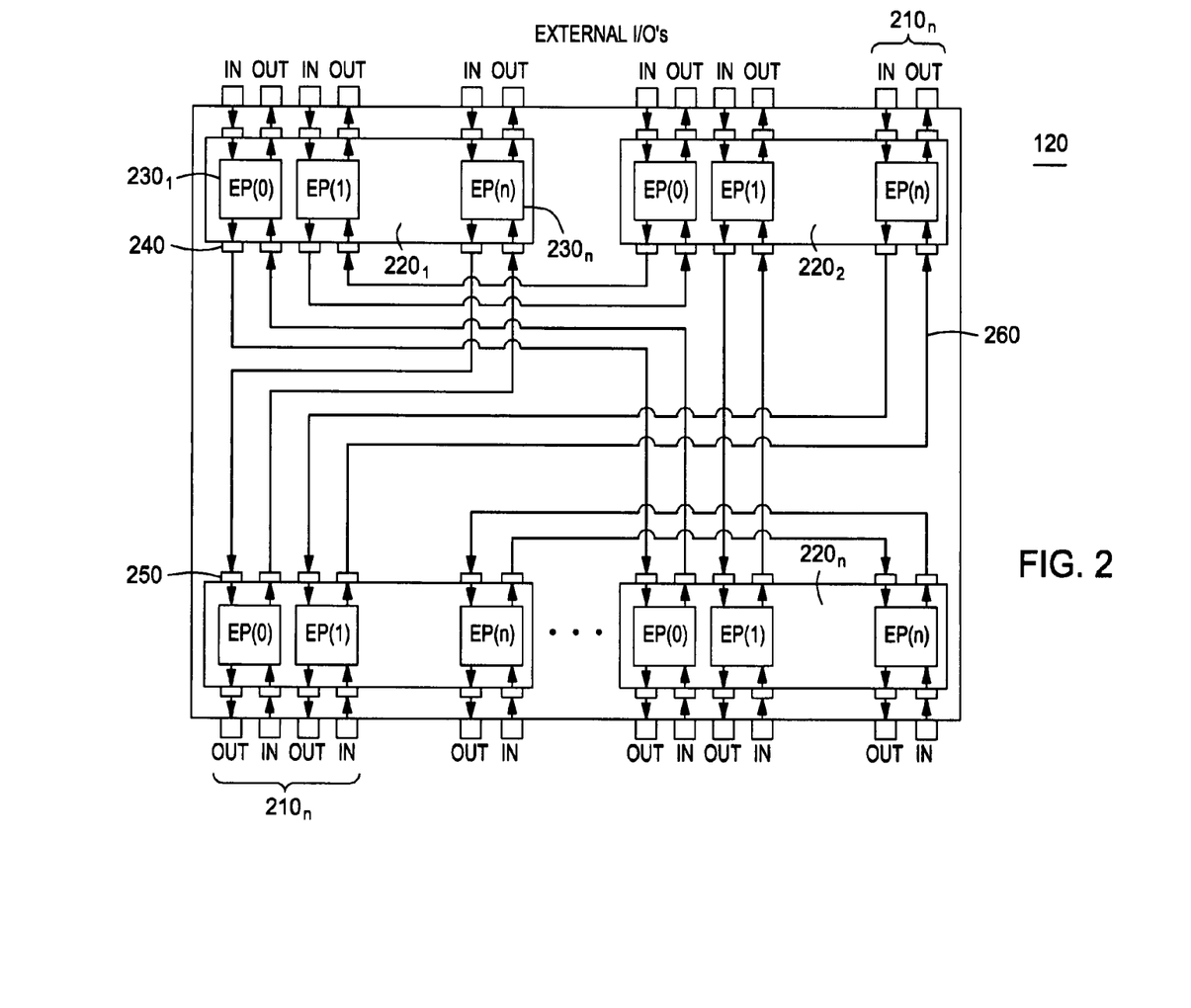
FIG. 2 is a block diagram of an emulation engine that is part of the emulation system.

FIG. 2 is a block diagram of an emulation engine 200 (120 in FIG. 1). The emulation engine 200 comprises clusters 220 of processor modules 230. The emulation engine 200 communicates with the target system (130 in FIG. 1) and the emulation support facilities (110 in FIG. 1) through multiple inputs and outputs, collectively $210_n$. Each cluster 220 comprises multiple processor modules $230_n$ and multiple cluster inputs 250 and cluster outputs 240. The outputs 240 of each cluster 220 connect directly to the inputs 250 of the other clusters 220 within the emulation engine 200, i.e., the output 240 is coupled to every other cluster input 220.

An emulation engine 200 contains multiple processor modules 230. All processor modules 230 within the emulation engine are identical. In one embodiment of the invention, a processor 230 emulates either a four input logic function, or a memory array access according to an emulation program provided by the emulation support facilities (110 in FIG. 1). The output data of a processor module 230 is made available to other processor modules 230 and processor module clusters 220 via interconnections 260 within the emulation engine 200.

Figure 3:
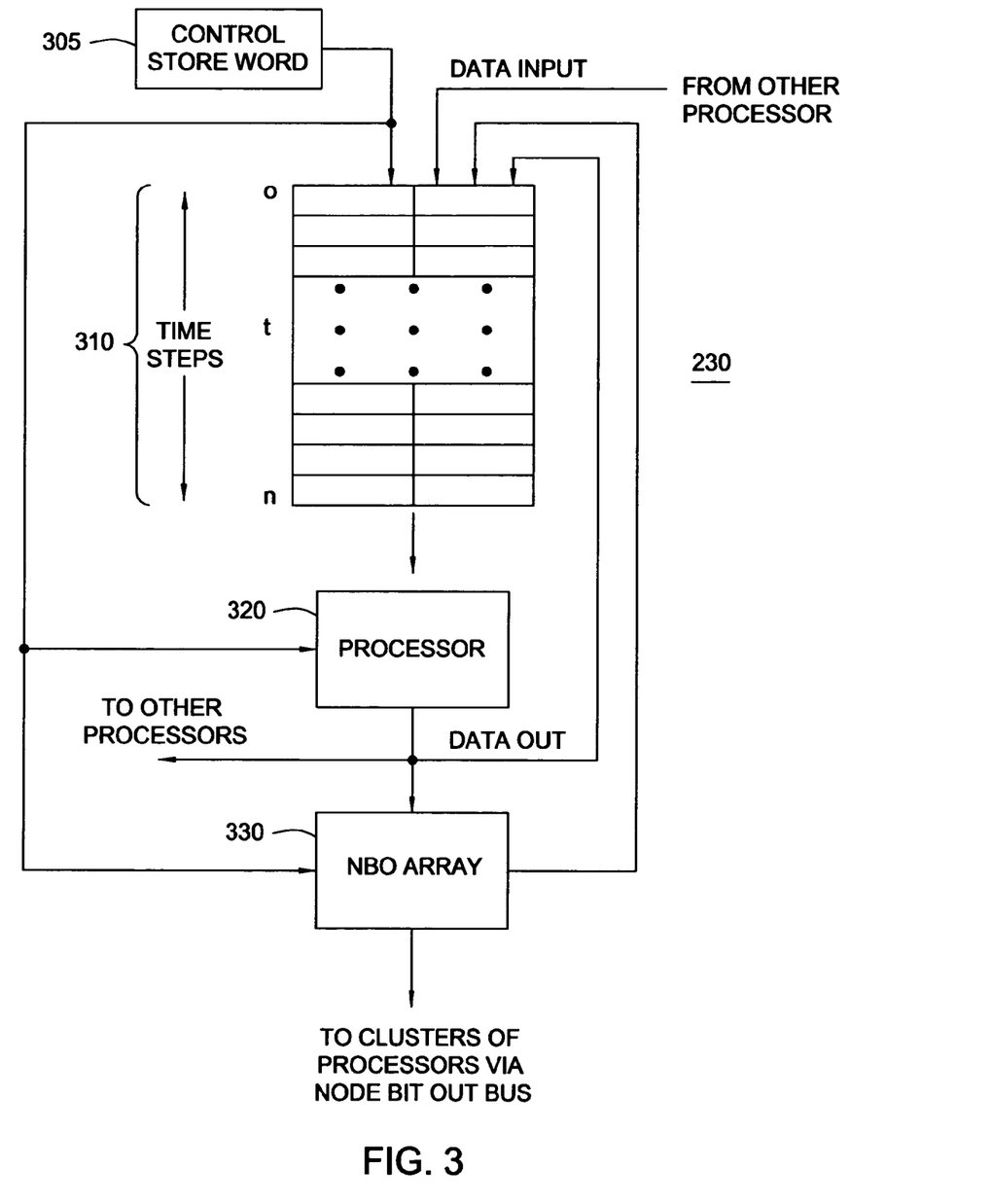
FIG. 3 is a simplified block diagram of a processor that is part of the emulation engine.

FIG. 3 is a simplified block diagram of a processor module 230. An emulation engine (shown in FIG. 2) comprises multiple processor modules 230. Each processor module 230 comprises a data array 310, a processor 320 and an output array referred to herein as a node bit out array 330. Data from the data array 310 is coupled to the processor 320. The output data from the processor 320 is written to a node bit out array 330, the data array 310, or directly to another processor.

The data array 310 has a depth, n, equal to the number of steps the emulation engine (shown in FIG. 2) is capable of evaluating per cycle. Output data from the processor 320 is written sequentially to a unique location within the data array 310, NBO array 370 and other processors 320. The control store word 305 defines the memory addresses used to read and write the data. After n steps, the data array 310 is full and new output data cannot be written to the data array 310 without overwriting previously stored data.

The processor 320 emulates a logic function that is defined by a control store word 305. The processor 320 receives data input from the data array 310 and an associated control store word 305. The processor 320 processes the data in the manner defined by the associated control store word 305.

The data out signal from a processor 320 is distributed to each of the other processors, the node bit out array 330 and the data array 310. During any logic or memory operation, the data out signal of a processor 320 may be accessed by none, one, or all of the processors within the processor module 230.

The node bit out array 330 stores processed output data from the processor 320 at a memory address defined by the control store word 305. The node bit out array provides an efficient method of storing and transferring data between processors, processor modules, and clusters. The node bit out array 330 makes data available to other processors and to clusters that is not currently available during the current cycle. The node bit out array 330 also reduces the amount of time a processor 320 or cluster of processors has to wait for previously evaluated data to be available for use as an input in subsequent evaluation steps thus increasing the efficiency of the hardware emulator.

Figure 4:
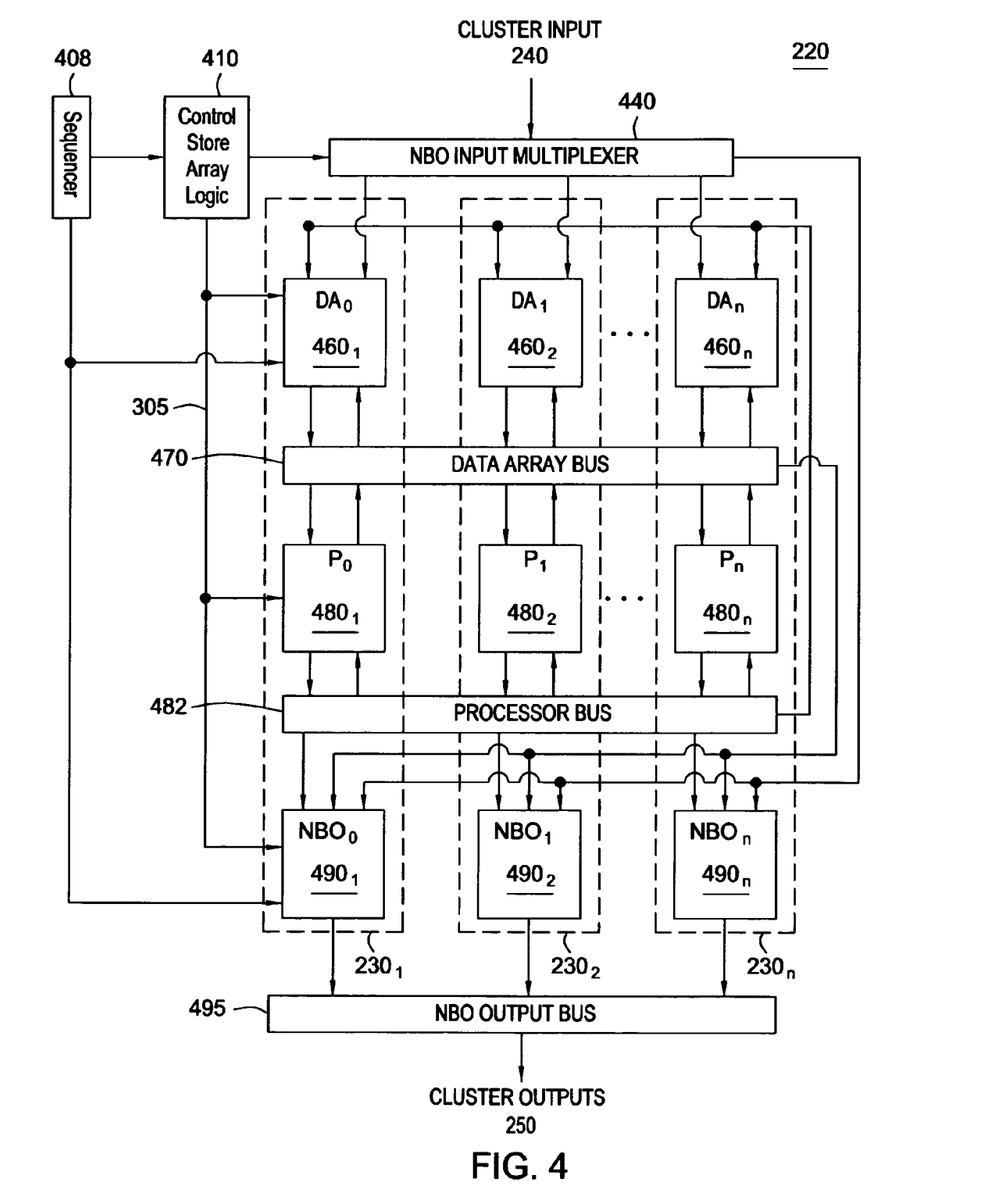
FIG. 4 is a block diagram of a multiprocessor based emulation engine that utilizes one embodiment of the present invention.

FIG. 4 is a block diagram of a duster 220. The duster 220 comprises a plurality of processor modules 230, a NBO Input multiplexer 440, a control store array logic 410, and a sequencer 408. The modules 230 comprise a processor $480_1$, ... $480_n$, data array $460_1$, ... $460_1$, and a Node Bit Out (NBO) array $490_1$, ... $490_n$. The modules 230 are interconnected by a data array bus 470, a processor bus 482 and an NBO output bus 495.

The sequencer 408 is connected to the data arrays 460, the NBO arrays 490, and the control store array logic 410. For simplicity, the sequencer 408 is shown only connected to the first data array 460 and the first NBO array 490 in FIG. 4. The sequencer 408 causes the control store array logic 410 to sequentially output control store words 305. The control store words 305 control the operations of the processor modules 230. The control words determine which one of the cluster inputs 240 is selected by the NBO Input Multiplexer 440, the read address for the data array 460, the read address for the NBO array 490 and the function performed by the processors 480. The data array bus 470 interconnects the data arrays 460 and the processors 480 such that data from any processor or data array can be coupled to any other processor or data array within the cluster 220. The processor bus 482 interconnects the processors 480 and the NBO arrays 490 such that data generated by the processors can be coupled to any processor or any NBO array. The NBO array bus 495 interconnects the NBO arrays 490 within the cluster. The NBO array bus 495 has an output that can be coupled to other clusters 220 within the emulation engine.

An NBO input multiplexer 440 selectively couples an output from the NBO output bus of other clusters of processor modules to the data array 460 input data and the NBO array 490 input data. The NBO input multiplexer 440 selects a data word from the cluster inputs 240 using a control word provided by the control store array logic 410 and outputs the selected data word to a plurality of data arrays 460 and a plurality of NBO arrays 490. The data word is stored within one or more of the data arrays 460 and one or more of the NBO arrays 490. The sequencer 408 provides timing for writing the data word to a memory location within the data array and NBO array.

The control store array logic 410 comprises a control store word array. Each control store word array stores control words that are provided sequentially and repetitively under control of the sequencer 408. Each increment of the sequencer 408 causes the step value to advance from zero to a predetermined maximum value and corresponds to one design path clock cycle for the emulated design. The control words provide addresses for accessing data within the data array 460 and the NBO array as well as provide the function that will be emulated by the processor 320.

The data array bus 470 facilitates the transfer of data between the plurality of data arrays 460, the plurality of processors 480, and into the plurality of NBO arrays 490. Data can be coupled to the data array bus 470 from a data array within the plurality of data arrays 460, and from a processor within the plurality of processors 480.

The processor bus 482 facilitates the transfer of data between the plurality of processors 480, and to the plurality of node bit out arrays 490 and the plurality of data arrays 460. Data is coupled to the processor array bus 482 from the plurality of processors 480.

The NBO output bus 495 facilitates the transfer of data from the plurality of node bit out arrays 490 to other processor clusters 220. The NBO output bus 495 provides an NBO bus output 240 that couples to the plurality of processor clusters 220 within the emulation engine.

Figure 5:
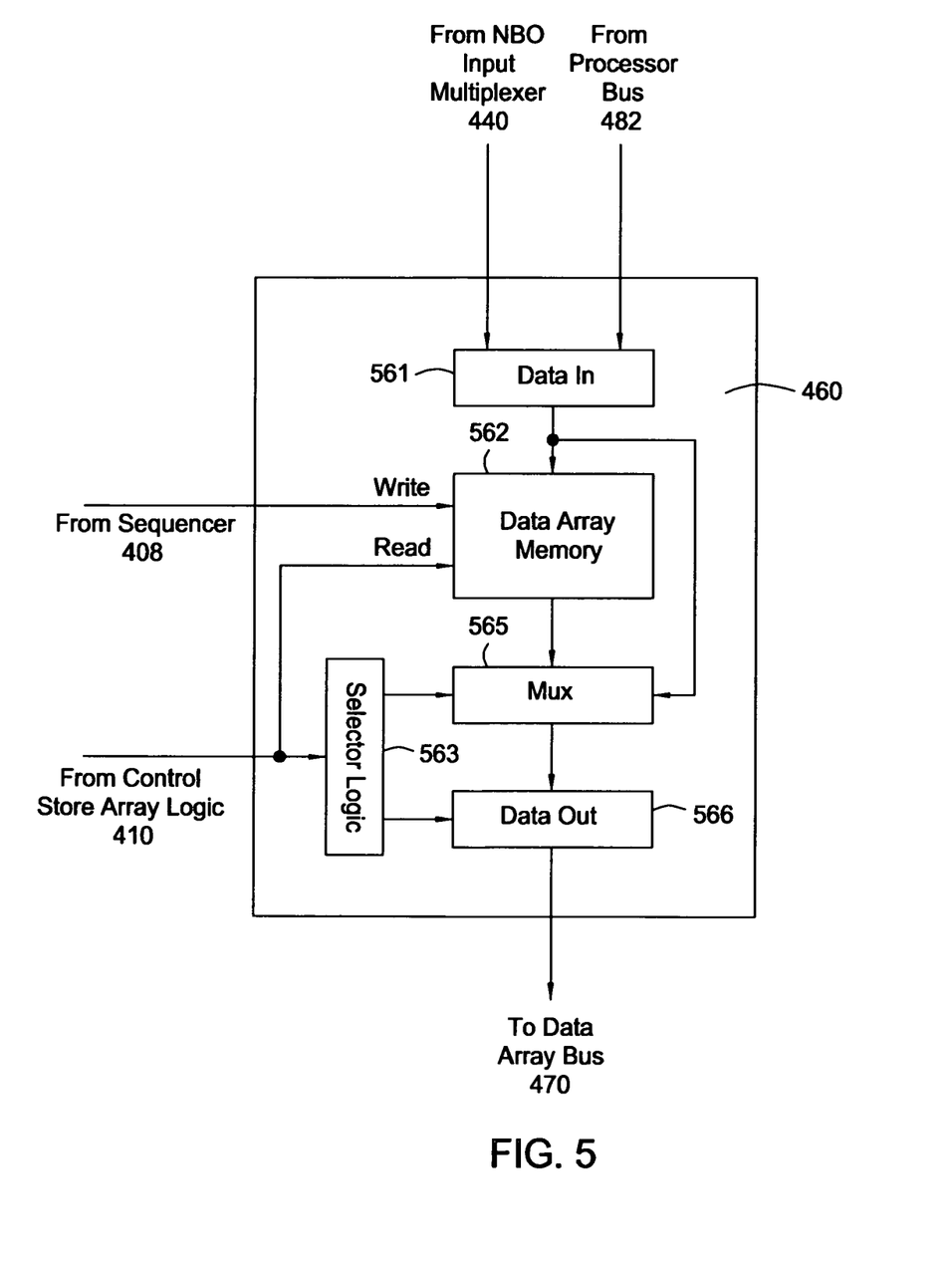
FIG. 5 is a block diagram of a data array.

FIG. 5 is a block diagram of a data array 460. The data array 460 comprises a "data in" register 561, a data array memory 562, a selector logic 563, a multiplexer 565, and a data out register 566. The "data in" register 561 receives input data from the NBO input multiplexer 440 and the processor bus 482. The sequencer 408 is coupled to the data array memory 562 and used to identify a particular write area of memory within the data array memory 562. The data array 460 stores input data in a register 561 and then stores the input data in a data array memory 562. A multiplexer 565 coupled to a selector logic 563, controlled by the current control store word from the control store array logic 410, produces output data that is written to an output register 566 and transferred out of the data array 460 through the data array bus 470.

Figure 6:
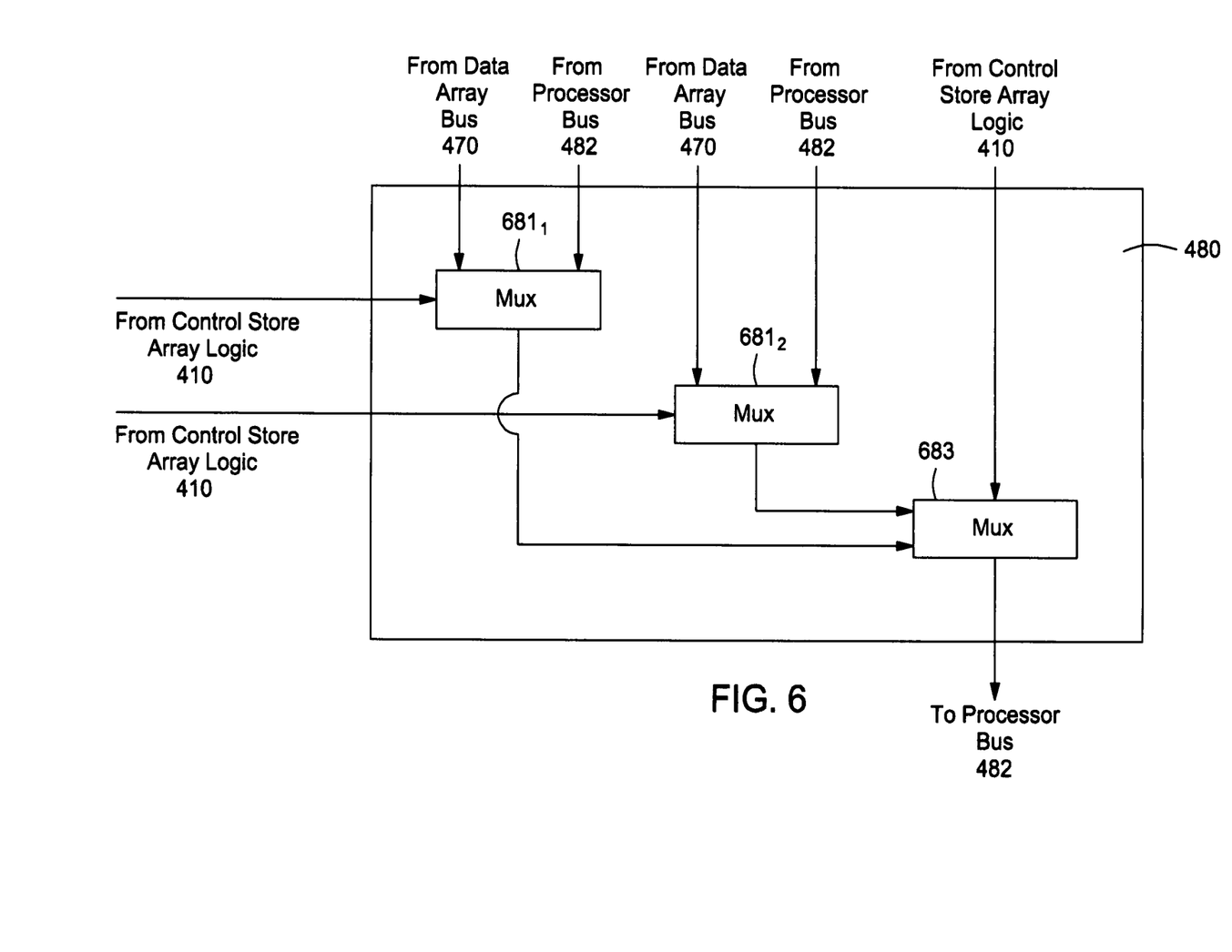
FIG. 6 is a block diagram of a processor.

FIG. 6 is a block diagram of a processor 480. The processor comprises a pair of multiplexers 681₁ and 681₂ and a third multiplexer 683. The processor 480 receives multiple inputs from the data array bus 470 and the processor bus 482. A first pair of inputs from a data array bus 470 and a processor bus 482 are selected at a multiplexer 681₁. A second pair of inputs from a data array bus 470 and a processor bus 482 are selected at a multiplexer 681₂. An input from the control store word stack 305 is selected at a third multiplexer 683 using the outputs from multiplexers 681₁ and 681₂. The output of the third multiplexer 683 is transferred out of the processor through the processor bus 482.

The processor 480 is a fundamental component of the emulation engine 200. The processor's primary function is to execute an N-input logical function (where N is any integer) and produce a function bit out during each step of the sequencer 408. The specific function is defined by a word from the control store array logic 410. The inputs for each logic function are supplied from a variety of sources, including bits stored from a previous operation, or from another one or more processors. The resulting function bit out may correspond to any one of: a logic gate output of the emulated design, a register output of the emulated design, a synthesized intermediate logic state, or a control bit generated for the emulation process. Additional common operations performed by the processor during a sequencer step include storing the function bit out for subsequent use by the processor, capturing and storing external (to the processor) data, receiving data from another processor, and latching data for use by another processor.

Figure 7:
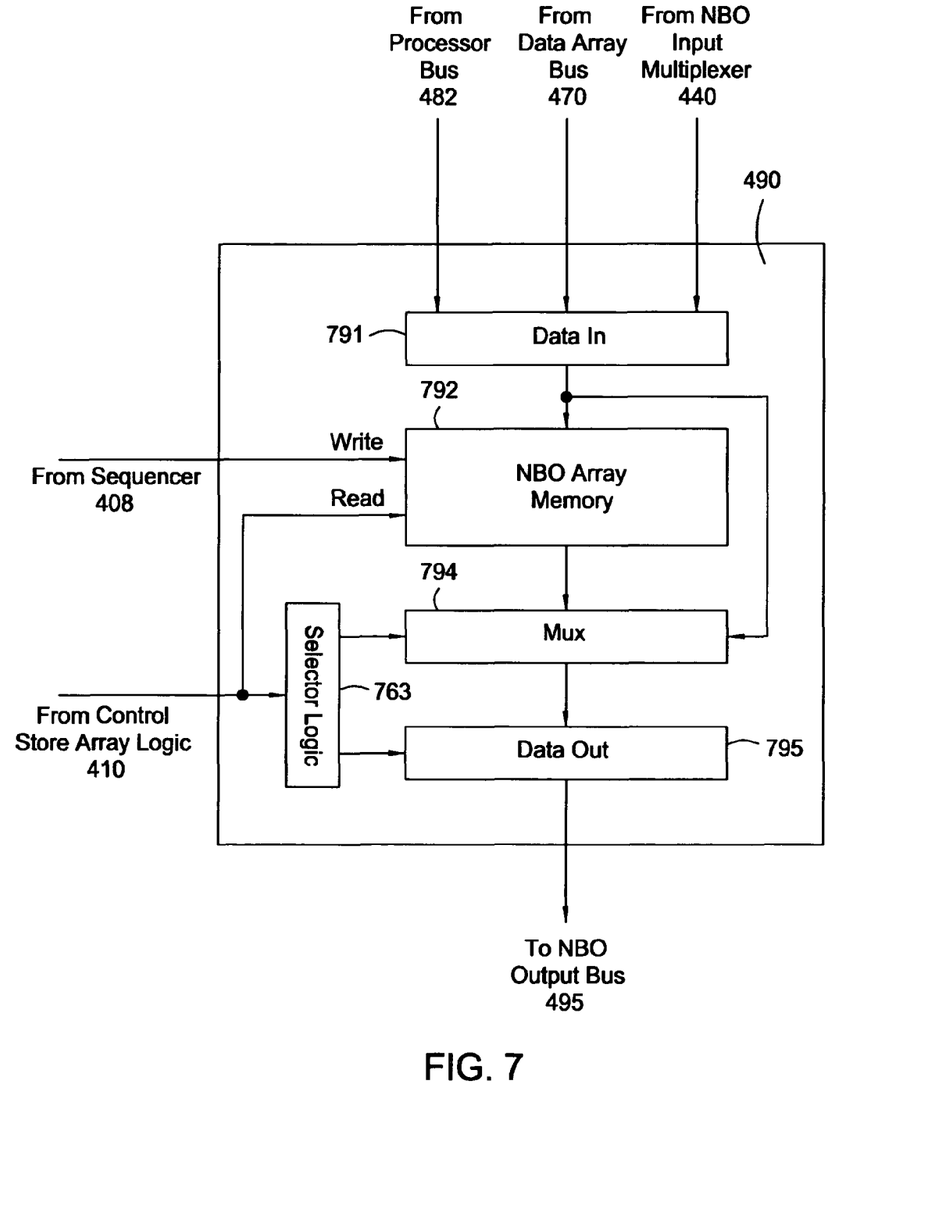
FIG. 7 is a block diagram of a node bit out array.

FIG. 7 is a block diagram of a node bit out array 490. The node bit out array 490 comprises an input register 791, a node bit out array memory 792, a selector logic 763, a multiplexer 794, and an output register 795. The node bit out array 490 receives three data inputs, one from a data array bus 470, one from a processor bus 482, and one from a NBO input multiplexer 440. The node bit out array 490 stores the input data in an input register 791 and then stores the data in a node bit out array memory 792. A multiplexer 794 with selector logic 793 produces an output that is written to an output register 795 and the output is transferred out of the node bit out array 490 via the NBO output bus 495.

Figure 8:
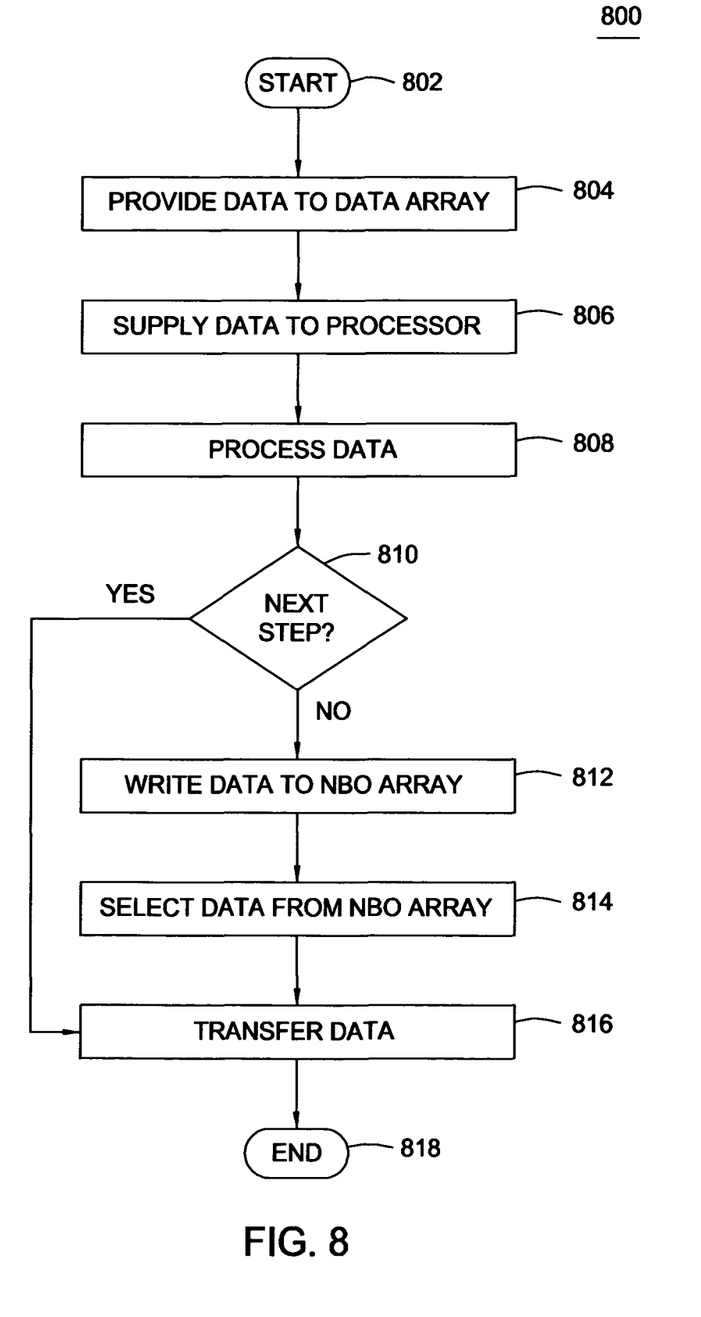
FIG. 8 is a flow diagram that utilizes one embodiment of the method of the present invention.

FIG. 8 is a flow diagram of a method for improving the efficiency of an emulation engine that utilizes one embodiment of the present invention. The method 800, starts at block 802 and proceeds to block 804. At block 804, data is provided to a data array. At block 806, the data is supplied to a processor from the data array. At block 808, the processor processes the data. The processor processes one set of input data supplied from the data array per emulation step. At decision block 810, a determination is made whether the processed data is to be written to another processor or cluster on the subsequent emulation step. If the decision is yes, the method proceeds to block 816 and the processor directly writes the processed data to the appropriate processor or cluster. If the decision is no, the method proceeds to block 812 and the processor writes the processed data to an NBO array. At block 814, a processor or cluster selects data from the NBO array. At block 816, the NBO array writes the data to the appropriate processor or cluster. The method ends at block 818.

The present invention improves upon previous emulation engines by storing processed data in a node bit out array. Without the node bit out array a processor cycle must be used when data cannot be transferred on the current cycle. A processor cycle must be used to access the data to be transferred from the data array, so that processor can not be used for an emulated gate that cycle. The node bit out array allows the processed data to be transferred later without using any processor or data array cycles. Storing and accessing the processed data through the node bit out array frees up processor cycles to emulate more gates, increasing the efficiency of the emulation process.

While the foregoing is directed to embodiments of the present invention, other and further embodiments of the invention may be devised without departing from the basic scope thereof, and the scope thereof is determined by the claims that follow.

The invention claimed is:

1. An apparatus for emulating hardware comprising:
   a data array configured to store input data for a current emulation cycle;
   a node bit out array comprising a memory array configured to store output data from a previous emulation cycle generated by at least one processor in a first cluster of processors; and
   a processor, in a second cluster of processors, configured to emulate a logic gate function during the current emulation cycle using selected input data from the data array and selected output data from the node bit out array, wherein the node bit out array is configured to store data from a cluster of processors other than the second cluster of processors in the memory array to allow for retrieval.

2. The apparatus of claim 1 further comprising an interconnection between the node bit out array and the data array to couple output data to the data array as input data.

3. The apparatus of claim 1 wherein the data array is one data array in a plurality of data arrays.

4. The apparatus of claim 1 wherein the node bit out array is one output array in a plurality of node bit out arrays.

5. The apparatus of claim 1 further comprising a sequencer for providing timing to the data array and the node bit out array.

6. The apparatus of claim 1 further comprising control logic for providing a control word to the data array, processor, and node bit out array.

7. The apparatus of claim 1 wherein the data array is one data array in a plurality of data arrays, and the node bit out array is one node bit out array in a plurality of node bit out arrays, where the plurality of data arrays and the plurality of node bit out arrays are part of the second cluster of processors.

8. The apparatus of claim 7 further comprising an interconnection between the plurality of data arrays and the cluster of processors and an interconnection between the cluster of processors and the plurality of node bit out arrays.

9. The apparatus of claim 7 further comprising a sequencer for providing timing to the plurality of data arrays and the plurality of node bit out arrays.

10. The apparatus of claim 9 further comprising an interconnection between the sequencer and each of the data arrays within the plurality of data arrays and an interconnection between the sequencer and each of the node bit out arrays within the plurality of node bit out arrays.

11. The apparatus of claim 7 further comprising a multiplexer, coupled to the plurality of node bit out arrays, for selectively coupling data from the plurality of node bit out arrays to the plurality of data arrays.

12. The apparatus of claim 7 further comprising control logic, coupled to the plurality of data arrays and the plurality of node bit out arrays, for providing a control word comprising an address within the plurality of data arrays and the node bit out arrays.

13. The apparatus of claim 12 wherein the control word further provides the function that is performed by each of the processors in the cluster of processors.

14. An apparatus for emulating hardware comprising:
a plurality of data arrays configured to store input data for a current emulation cycle
a plurality of node bit out arrays, wherein each node bit out array comprises a memory array and is configured to store output data from a previous emulation cycle generated by at least one processor in a first cluster of processors;
a multiplexer configured to provide selected output data from the plurality of node bit out arrays to the plurality of data arrays;
a plurality of processors in a second cluster of processors, the plurality of processors coupled to the plurality of data arrays and configured to emulate logic gate functions during the current emulation cycle using selected input data and the selected output data as stored in the plurality of data arrays;
control logic for providing control words to the plurality of data arrays, the plurality of processors and the plurality of node bit out arrays, wherein the control words provide addresses to the plurality of data arrays and the plurality of node bit out arrays for accessing the selected input data and the selected output data and provide the function of each processor; and
a sequencer for providing timing to the control logic, wherein the node bit out array is configured to allow for data retrieval from a cluster of processors other than the second cluster of processors.

15. The apparatus of claim 14 wherein the plurality of data arrays, and the plurality of node bit out arrays are part of the second cluster of processors.

16. A method for emulating hardware comprising:
storing output data generated by at least one processor in a first cluster of processors during a previous generation in a memory array of a node bit out array;
storing input data in a data array for a current generation;
accessing selected input data from the data array, and selected output data from the node bit out array, for processing by a processor in a second cluster of processors;
emulating a logic gate function using the processor during the current emulation cycle to process the selected input data and the selected output data in the processor to produce processed data; and
writing the processed data to the node bit out array, wherein the node bit out array is configured to store data from a cluster of processors other than the second cluster of processors in the memory array to allow for retrieval.

17. The method of claim 16 wherein the processed data stored in the node bit out array is available to a plurality of data arrays and the processors associated with the arrays.

* * * * *